(12) United States Patent
Ranjan et al.

(10) Patent No.: US 9,625,835 B2
(45) Date of Patent: Apr. 18, 2017

(54) LITHOGRAPHIC APPARATUS AND DEVICE MANUFACTURING METHOD

(71) Applicant: ASML NETHERLANDS B.V., Veldhoven (NL)

(72) Inventors: Manish Ranjan, Eindhoven (NL); Carlo Cornelis Maria Luijten, Duizel (NL); Franciscus Johannes Joseph Janssen, Geldrop (NL); Maksym Chernyshov, Delft (NL)

(73) Assignee: ASML NETHERLANDS B.V., Veldhoven (NL)

( * ) Notice: Subject to any disclaimer, the term of this patent is extended or adjusted under 35 U.S.C. 154(b) by 86 days.

(21) Appl. No.: 14/356,358

(22) PCT Filed: Oct. 12, 2012

(86) PCT No.: PCT/EP2012/070247
§ 371 (c)(1),
(2) Date: May 5, 2014

(87) PCT Pub. No.: WO2013/072144
PCT Pub. Date: May 23, 2013

(65) Prior Publication Data
US 2015/0015856 A1    Jan. 15, 2015

Related U.S. Application Data

(60) Provisional application No. 61/561,117, filed on Nov. 17, 2011.

(51) Int. Cl.
*B60R 1/06* (2006.01)
*G03B 27/52* (2006.01)
*G03F 7/20* (2006.01)

(52) U.S. Cl.
CPC ...... *G03F 7/70875* (2013.01); *G03F 7/70633* (2013.01); *G03F 7/70716* (2013.01); *G03F 7/70933* (2013.01)

(58) Field of Classification Search
CPC ............ G03F 7/70633; G03F 7/70716; G03F 7/70858; G03F 7/70866; G03F 7/70875; G03F 7/70916; G03F 7/70933
(Continued)

(56) References Cited

U.S. PATENT DOCUMENTS 7,352,434 B2   4/2008   Streefkerk et al.
7,684,008 B2   3/2010   De Smit et al.
(Continued)

FOREIGN PATENT DOCUMENTS

CN   1550905    12/2004
CN   1637608    7/2005
EP   1 326 139  7/2003

OTHER PUBLICATIONS

Chinese Office Action dated Jun. 30, 2015 for corresponding Chinese Patent Application No. 201280056174.9 (10 pages).
(Continued)

*Primary Examiner* — Colin Kreutzer
(74) *Attorney, Agent, or Firm* — Pilsbury Winthrop Shaw Pittman LLP

(57) ABSTRACT

A lithographic apparatus includes a substrate table constructed to hold a substrate, a projection system configured to project a patterned radiation beam through an opening and onto a target portion of the substrate, and a conduit having an outlet in the opening. The conduit is configured to deliver gas to the opening. The lithographic apparatus includes a temperature control apparatus disposed in a space between the projection system and the substrate table. The temperature control device is configured to control the temperature
(Continued)

of the gas in the space after the gas passes through the opening.

14 Claims, 3 Drawing Sheets

(58) Field of Classification Search
USPC .......................................... 355/30; 359/509
See application file for complete search history.

(56) References Cited

U.S. PATENT DOCUMENTS

| | | | |
|---|---|---|---|
| 8,730,448 B2* | 5/2014 | Nienhuys | G03F 7/70891 355/30 |
| 2004/0211920 A1 | 10/2004 | Derksen et al. | |
| 2005/0069433 A1 | 3/2005 | Hayashi | |
| 2005/0140946 A1* | 6/2005 | Tsuji | G03F 7/70858 355/30 |
| 2006/0033892 A1* | 2/2006 | Cadee | G03F 7/70341 355/30 |
| 2006/0060140 A1 | 3/2006 | Lee et al. | |
| 2006/0215137 A1 | 9/2006 | Hasegawa et al. | |
| 2007/0085984 A1 | 4/2007 | Banine et al. | |
| 2008/0204678 A1* | 8/2008 | DiBiase | G03F 7/70875 355/30 |

OTHER PUBLICATIONS

International Search Report for PCT/EP2012/070247, mailed Jan. 25, 2013 (2 pages).
Chinese Office Action dated Sep. 26, 2016 in corresponding Chinese Patent Application No. 201280056174.9.
Taiwan Office Action dated Aug. 25, 2016 in corresponding Taiwan Patent Application No. 101139544.

* cited by examiner

LITHOGRAPHIC APPARATUS AND DEVICE MANUFACTURING METHOD

CROSS REFERENCE TO RELATED APPLICATIONS

This application is the U.S. national phase entry of International Patent Application No. PCT/EP2012/070247, filed Oct. 12, 2012, which claims the benefit of U.S. provisional application 61/561,117, filed on Nov. 17, 2011 both of which are incorporated herein in their entireties by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In order to project a pattern onto a substrate with a desired accuracy using an EUV lithographic apparatus, it is desirable to control the temperature of the substrate. This is because an uncontrolled change of the substrate temperature may cause the substrate to expand or contract such that the projected pattern is not positioned with a desired accuracy on the substrate (e.g. is not overlaid with a desired accuracy on a pattern already present on the substrate). A known problem in this regard is that a purge gas that is used to prevent contaminants, originating from the exposed resist and/or wafer stage compartment, causes a net positive heat load on the wafer surface. This heat load, in turn, can result in large undesirable thermal deformations of the wafer.

SUMMARY

According to an aspect of the invention, there is provided a lithographic apparatus comprising a substrate table constructed to hold a substrate, a projection system configured to project a patterned radiation beam through an opening and onto a target portion of the substrate, and a conduit configured to deliver gas to the opening, and to provide a flow of the gas out of the opening to a space between the projection system and the substrate table, wherein the lithographic apparatus is provided with a temperature control device configured to control the temperature of the gas in said space after the gas passes through the opening.

In an embodiment of the invention, the temperature control device comprises temperature control means, or a temperature controller, which includes both heating means, or a heater, and cooling means, or a cooler. The heating and cooling means are configured to provide a net cooling effect to the gas.

Desirably, the heating means and the cooling means are disposed in a space between the projection system and the substrate table. The heating means and the cooling means may be mounted on a support member located in the space. The support member may be mounted on a surface of the projection system facing the substrate table and either in thermal communication with said surface or thermally insulated from said surface.

The heating means may comprise at least one resistive heating element. Desirably, the at least one resistive heating element comprises a plurality of independently controllable segments. In other embodiments there may be a plurality of independently controllable resistive heating elements.

Desirably, the cooling means comprises at least one cooling element which may desirably be at least one heat-pipe arranged to carry a cooling fluid cooled at a remote source.

In embodiments of the invention, the temperature control means is configured to control the amount of cooling by controlling the heating means.

Some embodiments of the invention may further comprise a metrology apparatus configured to measure overlay of a pattern projected onto the substrate by the lithographic apparatus, wherein a control system is configured to determine an adjustment of operation of the temperature control device based upon an output from the metrology apparatus. The lithographic apparatus may further comprise a measurement apparatus configured to measure infrared reflectivity of the substrate. The control system may be configured to determine an adjustment of operation of the temperature control device based on the measured reflectivity of the substrate.

According to another aspect of the invention there is provided a device manufacturing method comprising projecting a patterned beam of radiation through an opening in a projection system onto a substrate, and delivering gas to the opening in the projection system via a conduit, wherein the method further comprises controlling the temperature of the gas such that the temperature of the gas is controlled in a space between the projection system and the substrate after passing through the opening.

Desirably, the temperature control comprises cooling that is achieved by over-cooling using cooling means and heating using heating means.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
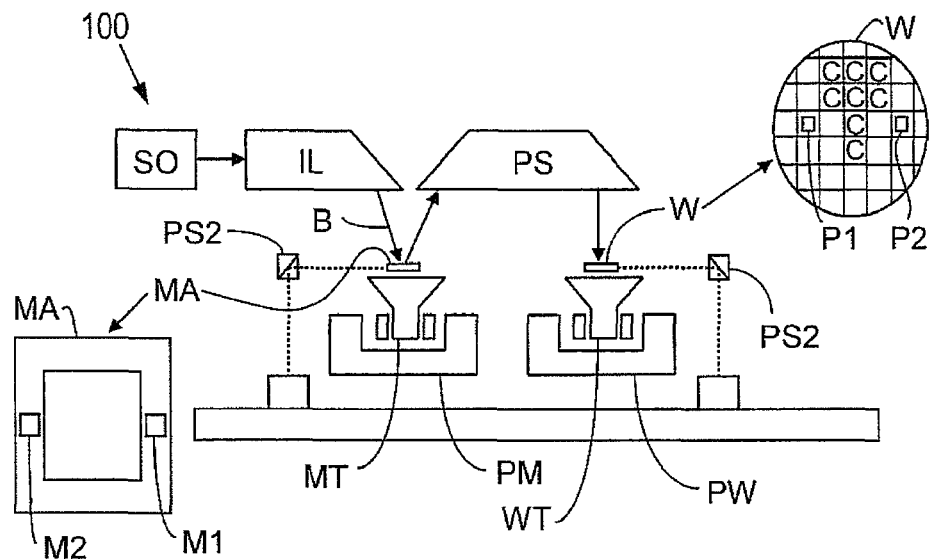
FIG. 1 schematically depicts a lithographic apparatus according to an embodiment of the invention.

FIG. 1 schematically depicts a lithographic apparatus 100 according to an embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps. Some gas may be provided in some parts of the lithographic apparatus, for example to allow gas flow to be used to reduce the likelihood of contamination reaching optical components of the lithographic apparatus.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP"), the desired plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases, the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus may be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
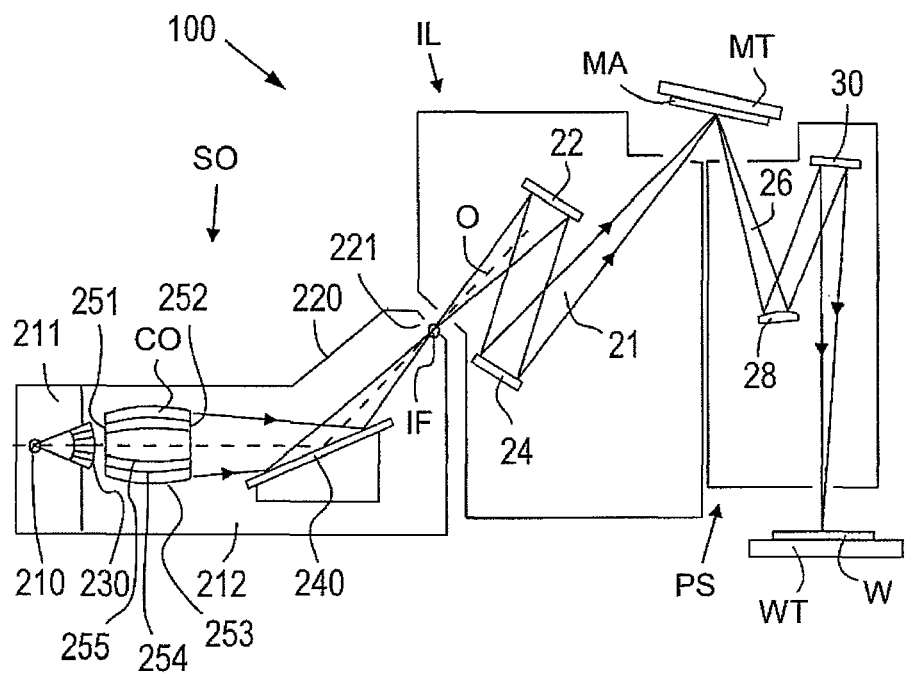
FIG. 2 schematically depicts a more detailed view of the apparatus of FIG. 1, including a discharge produced plasma source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is desirably used in combination with a discharge produced plasma source, often called a DPP source.

Figure 3:
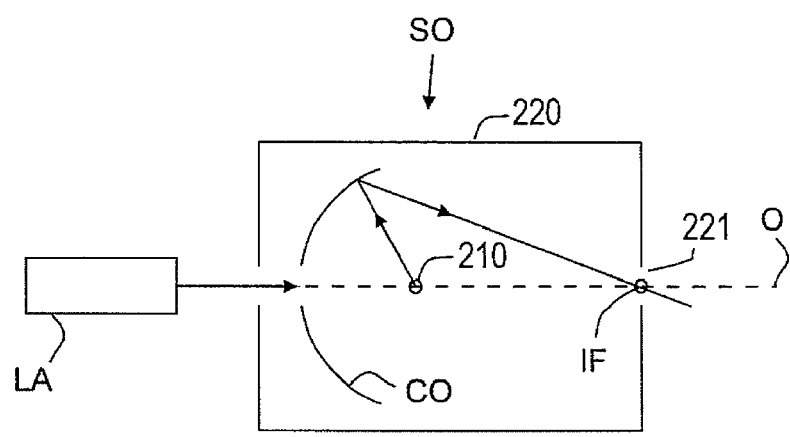
FIG. 3 schematically depicts a view of an alternative source collector module of the apparatus of FIG. 1, the alternative being a laser produced plasma source collector module.

Alternatively, the source collector module SO may be part of a laser produced plasma (LPP) radiation system, as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
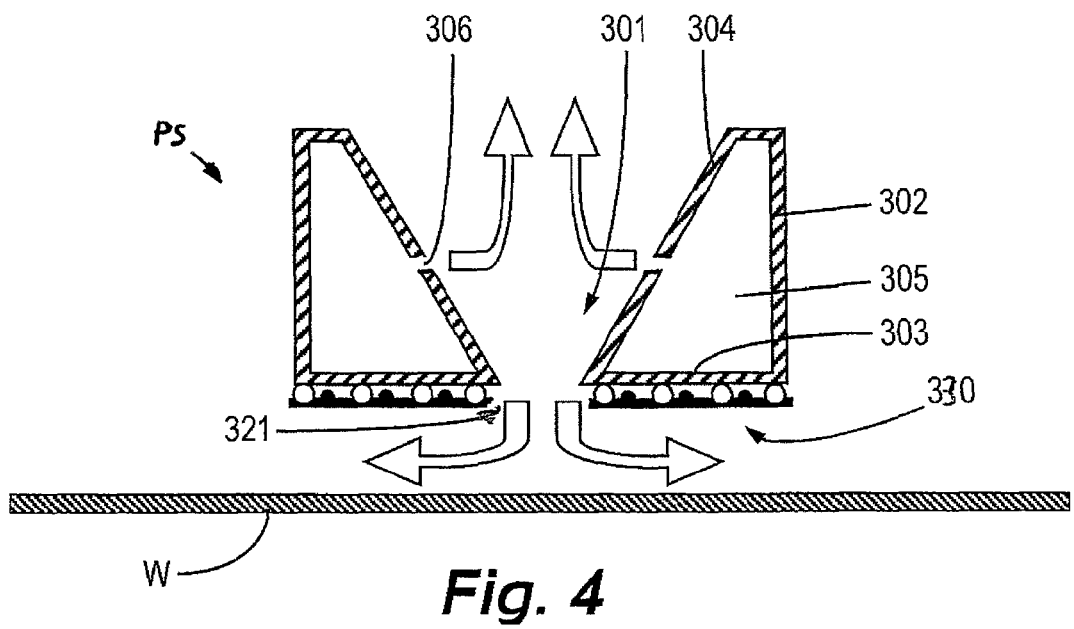
FIG. 4 schematically depicts part of a projection system of the lithographic apparatus and a substrate as held by a substrate table.

FIG. 4 shows schematically in cross-section a lower portion of the projection system PS, i.e., a portion facing the substrate holder WT. The projection system PS includes an opening 301 through which in use a patterned radiation beam is projected onto a target portion of the substrate. The opening may be formed by a sloped inner surface 304 of an opening defining wall 302. Wall 302 is hollow and defines an annular chamber 305 which receives gas from a gas supply (e.g. via a delivery pipe not shown) and delivers gas to the opening 301 through an annular slit 306 formed in the sloped inner surface 304. The delivery pipe, chamber 305 and slit 306 may together be considered to form a conduit which delivers gas to the opening 301. The conduit may have any other suitable form that serves to supply gas to the opening 301.

The annular slit 306 is an example of an outlet. The outlet may have any suitable form. The outlet may for example comprise a plurality of holes. The plurality of holes may be distributed around the outlet. The holes may be rectangular, square, circular, or may have any other suitable shape. The reference 306 in FIG. 4 may refer to any such outlets; an outlet will also be referred to as outlet 306 hereinafter.

It is desirable to reduce the likelihood that contamination (e.g. gas-phase organic compounds coming from the resist on the substrate W) will travel from the substrate W into the interior of the projection system PS. This is because the contamination may accumulate on optical surfaces such as the mirrors 28,30 and cause the reflectivity of such surfaces to be reduced. This in turn may reduce the intensity of EUV radiation available for projection onto the substrate W, and therefore reduce the throughput of the lithographic apparatus (i.e. the number of substrates which may be patterned per hour by the lithographic apparatus).

The gas supplied to the opening 301 through the annular slit 306 serves as a purge gas that reduces the likelihood of contamination passing from substrate W through the opening 301 and into the projection system PS. The flow of gas is schematically represented by arrows in FIG. 4. The gas travels into and within the annular chamber 305 such that the pressure of gas at the entrance to the annular slit 306 is substantially equal around the circumference of the annular chamber 305. There may be some variation in pressure around the annular chamber 305 and to correct for this the chamber may include a baffle (not shown) which acts to encourage the gas to travel within the annular chamber, thereby assisting with equalization of the pressure of the gas within the annular chamber. Gas passes through the annular slit 306 and into the opening 301. A portion of the gas travels upwards into the projection system PS. The remainder of the gas travels downwards, passing out of the opening 301 and then traveling away from the opening in a gap or space between the projection system PS and the substrate W. The flow of gas out of the opening 301 prevents or suppresses the passage of contamination from the substrate W into the projection system PS.

It is desirable to control the temperature of the substrate W. This is because an uncontrolled change of the substrate temperature may cause the substrate to expand or contract such that a projected pattern is not positioned with a desired accuracy on the substrate (e.g. is not overlaid with a desired accuracy on a pattern already present on the substrate). The flow of gas from the opening 301 onto the substrate W may heat the substrate in an unwanted manner that will be described further below. It may be desirable to prevent the flow of gas from heating the substrate in an unwanted manner. Additionally at least parts of the substrate may experience higher temperatures due to heating caused by EUV and infrared radiation incident on parts of the substrate. The infrared radiation may for example arise from an EUV emitting plasma 210 or a laser LA used in the generation of the EUV emitting plasma (see FIG. 3).

In an embodiment, the gas is cooled as it flows from the opening 301 to the edge of the substrate W. To provide the cooling of the gas as it flows from the opening 301 to the edge of the substrate W, the lithographic apparatus comprises a temperature control device 330 described in detail below. The temperature control device 330 is configured to control the temperature of the gas in the space between the projection system PS and the substrate W, after passing through the opening 301. The temperature of the gas may be controlled such that the temperature of the substrate W is not modified by the gas to such an extent that it causes unacceptable overlay errors to occur in the lithographic apparatus. It is appreciated that the space between the projection system PS and the substrate W is equivalent to the space between the projection system and the substrate table WT for the purpose of describing the technical features of the embodiment when the apparatus is not in use. In view of this equivalence there will not be made a distinction between the two definitions of this space in the description of the invention hereinafter.

The lithographic apparatus may have a reference temperature, which may for example be around 295 Kelvin (e.g. around room temperature which may be between 20 and 23° C.) or may be some other temperature. The reference temperature may be the temperature at which one or more components of the lithographic apparatus are held during operation of the lithographic apparatus. The lithographic apparatus may hold (or endeavour to hold) one or more of the substrate W, substrate table WT, projection system walls and opening defining wall 302 at the reference temperature. If the lithographic apparatus were to operate without the flow of gas, then the substrate W, substrate table WT, projection system walls and opening defining wall 302 may be at the reference temperature (or substantially at the reference temperature). An exception to this may be a portion of the substrate which is being exposed; this may have a higher temperature due to heating caused by EUV and infrared radiation incident on that portion of the substrate. The infrared radiation may for example arise from an EUV emitting plasma 210 or a laser LA used in the generation of the EUV emitting plasma (see FIG. 3).

When gas is flowing through the apparatus it may cause heating of the substrate W, even if the gas which is introduced into the chamber 305 initially has the same temperature as other components of the lithographic apparatus. This is because gas acquires heat as it travels to the substrate W, the heat then being transferred to the substrate from the gas. This heating of the substrate may lead to unacceptable overlay errors occurring during exposure of the substrate.

The mechanism via which the gas acquires heat as it travels to the substrate W is a consequence of the velocity at which the gas travels. Gas which is travelling to the annular chamber 305 through a delivery pipe will have a relatively high velocity (e.g. 100 m/s or greater). This relatively high velocity of the gas will cause a reduction of the temperature of the gas as it is flowing to the chamber. This may be understood by considering an example in which the gas is adiabatic (i.e. with no heat transfer taking place between the delivery pipe and the gas). If the gas is adiabatic then the total energy of the gas must remain constant. If the gas is stationary or slow moving (e.g. 10 m/s or less) when it enters the delivery pipe then all of the energy of the gas is thermal energy, and this is manifest as the temperature of the gas. However, when the gas is travelling at a relatively high velocity in the delivery pipe, the gas has significant kinetic energy due to its velocity. Since the total energy of the gas remains the same, the thermal energy of the gas (and hence its temperature) is reduced. Thus, in the adiabatic case, when a gas flows at a relatively high velocity, the temperature of the gas will be reduced.

The gas in an embodiment of the invention may flow at a relatively high velocity through the delivery pipe, and as a result of this relatively high velocity, the static temperature of the gas is reduced. If the gas and the projection system wall both have the same initial temperature (the initial gas temperature being the temperature of the gas before it flows through the delivery pipe), then when the gas is flowing through the delivery pipe it will have a static temperature which is lower than the temperature of the projection system wall. Because the gas has a lower static temperature than the projection system wall, heat will flow from the projection system wall to the gas as it travels through the delivery pipe. In an alternative embodiment, the gas may flow through the delivery pipe at a relatively low velocity, in which case the temperature of the gas will not be reduced. However, the temperature of the gas will be reduced when the gas flows through the annular slit 306.

The annular slit 306 through which the gas passes into the opening 301 is relatively constricted. Consequently, the gas will travel through the annular slit 306 at a relatively high velocity, and this will cause the temperature of the gas to be reduced (e.g. by several Kelvin or even up to tens of Kelvins). If the gas has a lower temperature than the opening defining wall 304 as it travels through the annular slit 306, heat will be transferred from the opening defining wall to the gas.

The gas may have a relatively high velocity when it enters the opening 301. However, the gas decelerates when it is incident upon the surface of the substrate W, since the substrate prevents the gas from continuing to travel downwards and forces the gas to change direction. As a result of this deceleration, kinetic energy in the gas is converted to thermal energy. Since heat has been transferred to the gas from the delivery pipe and the opening defining wall 304, the gas has a total temperature which is higher than its total temperature before it entered the delivery pipe. The total temperature of the gas may for example be higher than the reference temperature of the lithographic apparatus. It is this higher total temperature of the gas which may cause undesirable heating of the substrate W.

In an embodiment, the opening defining wall 302 may be insulated to reduce the amount of heat which may flow to the opening defining wall from the projection system walls (or other parts of the lithographic apparatus). This reduces the amount of heat that may be transferred to the gas as it passes through the annular slit 306. The insulation may for example comprise providing a gap and/or insulating material between the opening defining wall 302 and the projection system walls (the latter walls not shown in FIG. 4).

In an embodiment, the opening defining wall 302 may be constructed from an insulating material. For example, the opening defining wall 302 may be constructed from a ceramic, e.g. Macor ceramic, which is available from Corning Inc. of Corning, USA (or some other suitable ceramic). The opening defining wall 302 may be formed from glass. The opening defining wall 302 may be formed from a metal which has a lower thermal conductivity than some other metals. For example, the opening defining wall 302 may be formed from stainless steel, which may provide structural strength and which has a thermal conductivity significantly lower than that of aluminium.

In the embodiment of FIG. 4, the chamber 305 has an annular lower wall 303 that is parallel to the substrate W and which together with the substrate W defines a gap through which the gas flows. Secured to the lower wall 303 is a support member 320 in the form of an annular disk that carries temperature control means (or a temperature controller) to be described below, and that together with the temperature control means is part of aforementioned temperature control device 330. Support member 320 is provided with an opening 321 that is contiguous with the opening 301 so as not to impede the flow of gas or block the exposure radiation beam. Support member 320 serves to support temperature control means as will be described below and while an annular disk is a particular convenient form for the support member it may take any other suitable form.

Figure 5:
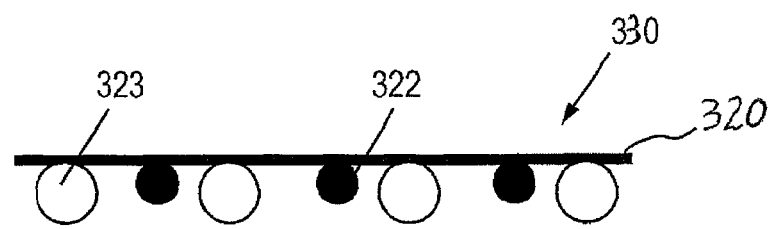
FIG. 5 is a detailed view of part of FIG. 4 showing the heating and cooling means.

FIG. 5 shows in more detail a section of the support member 320 extending from the edge of opening 321 to the outer circumference of the support member 320. Supported by the support member 320 are at least one heating means 322 (or heater) and at least one cooling means 323 (or cooler). Cooling means 323 may take any suitable form e.g. with a circular or rectangular cross section but desirably comprises a tube carrying cooling fluid supplied from a remote cooling unit (e.g. a Peltier cooler connected via a heat-pipe). Cooling can be delivered by means of, for example but not limited to, use of a heat pipe or a single-phase cooling fluid such as water or glycol. Heating means 322 may comprise at least one resistive heating element. The support member 320 is desirably formed of a thermally conducting material and is desirably a material with low outgassing so as not to risk adding contaminants to the substrate W beneath the support member 320. Suitable materials include aluminum, steel, and ceramics such as aluminum nitride or silicon carbide.

It should be noted that in FIG. 5, the heating and cooling means are both shown below the support member 320 whereas in FIG. 4 they are shown above the support member 320. Both options are possible.

The support member 320 is desirably secured to the lower wall 303 of chamber 305 though it may also be held in place by other means without necessarily contacting wall 303. Optionally, in some embodiments of the invention, the system may be arranged to pre-cool gas within the chamber 305. This may be done by ensuring that the support member 320 is in good thermal contact with the lower wall 303. Conversely, pre-cooling the gas in the chamber 305 may have some disadvantages in that the cooling might undesirably cool neighboring sub-modules or parts thereof. In this case, the support member 320 may be mounted separately so that it is adjacent but not in contact with the lower wall 303, or it may be fixed to the lower wall 303 with a thermally insulating material therebetween.

Although both heating and cooling means are provided, the primary objective is to provide a variable cooling effect on the gas as it flows from the opening 301 to the edge of the substrate W. A potential advantage of providing both heating and cooling means is that the response time of the system can be improved. The response time of cooling means is generally much slower than the response time of heating means. Embodiments of the present invention provide cooling with a rapid response time by using the cooling means 323 to over-cool the gas (i.e. to provide a degree of cooling that on its own would cool the gas to a lower temperature than is desired) and then to use the heating means 322 to heat the gas so that there is a net cooling effect. By keeping the over-cooling substantially constant, it is the heating means 322 that controls the net cooling and as the heating means has a relatively fast response time, the response time of the system is relatively fast. Optionally, only cooling or only heating may be provided, but the best results may be obtained with over-cooling combined with heating to produce a variable cooling that can be accurately controlled.

As explained, the system may provide over-cooling of the gas in combination with heating. This provides a wide range of control of the cooling with a rapid response time. The over-cooling is desirably left unchanged and control is provided by adjusting the heating. Control is enabled by providing a temperature feedback or feed-forward signal to a control system (not shown in any of the figures) constructed and arranged to control the operation of the temperature control device. In particular, the control system may be constructed and arranged to set or adjust respective temperatures of the heating means 322 and cooling means 323. This signal may be obtained from one or more temperature sensor(s) located on or adjacent to the disk 320. In some embodiments of the invention, the resistive heating element(s) may themselves act as one or more temperature sensors by monitoring the resistivity of the heating element(s).

In embodiments of the invention control signals may also be provided from other influencing modules of the lithographic apparatus to the control system. For example, signals indicative of the radiation energy for wafer exposure and the wafer chuck temperature may be provided as part of the feedback control.

The heating and cooling means 322, 323 may be configured on the disk 320 in a wide range of different configurations. In a particularly simple configuration there may be only a single heating element and a single cooling element, but desirably to provide the maximum degree of control, there may be a plurality of independently controllable heating elements or a single heating element sub-divided into independently controllable segments. Providing independently controllable heating elements or sub-divided independently controllable segments may allow the degree of net cooling to be controlled over different parts of the support member. Normally, for example, there will be a greater degree of cooling adjacent to the opening 301 as the gas is at its warmest at that point. Similarly, there may be multiple cooling elements to provide the maximum degree of control. In some embodiments, the heating and cooling means 322, 323 on the support member 320 may be provided into a number of different independently controllable sectors, each of which include at least one heating element or independently controllable heating element segment and at least one cooling element or part thereof.

In an embodiment, the temperature to which the temperature control device 330 cools the gas may be used (at least in part) to adjust the overlay achieved by the lithographic apparatus. Overlay may be considered to be a measurement of the accuracy with which the lithographic apparatus projects a pattern on top of a pattern already present on the substrate. The overlay achieved by the lithographic apparatus may be measured following exposure of a substrate by using a metrology apparatus (which may form part of the lithographic apparatus) to measure the positions of projected patterns relative to patterns previously present on the substrate. If a sub-optimal overlay is found, the pattern of which is indicative of the substrate having a temperature which is too high, then the cooling provided by the temperature control device 330 may be increased. Conversely, if a sub-optimal overlay is found, the pattern of which is indicative of the substrate having a temperature which is too low, then the cooling provided by the temperature control device 330 may be reduced or the amount of compensation heating may be increased. The cooling provided by the temperature control device 330 may be adjusted periodically in order to maintain a desired overlay accuracy.

The absorption of EUV radiation by the substrate may be relatively constant and predictable. However, the absorption of IR radiation by the substrate may vary significantly depending upon the form of the surface of the substrate. For example, if a structure has previously been exposed and processed on the substrate then the absorption of IR radiation by the substrate will depend upon the form of that structure. If the structure is formed from metal then the absorption of IR radiation will be less than the absorption would have been if the structure was formed from semiconductor material. The adjustment of the temperature of the gas delivered from the temperature control device 330 may take into account the reflectivity to and absorptivity of infrared radiation of substrates being exposed (or to be exposed) by the lithographic apparatus. In an embodiment, the reflectivity to and absorptivity of infrared radiation of a substrate (which may be representative of a plurality of substrates) may be performed in a measurement apparatus prior to exposure of the substrate (or plurality of substrates) by the lithographic apparatus. The measurement apparatus may form part of the lithographic apparatus. For example, an apparatus may direct an infrared radiation beam at the substrate and detect radiation reflected from the substrate, thereby allowing the reflectivity of the substrate to the infrared radiation to be determined. The absorptivity may also be measured. The infrared radiation may for example be 10.6 µm, and may for example be provided by a laser. The apparatus may for example be an apparatus that is used to perform measurements of other properties of the substrate (such an apparatus may be referred to as a metrology apparatus). The control system may adjust the temperature of the heating means 322, 333 to take into account the IR reflectivity and absorptivity of substrates which are to be exposed (or are being exposed) by the lithographic apparatus (for example, if the gas is being used to provide cooling that at least partially compensates for heating of the substrate caused by IR radiation).

The heating means 322 and cooling means 323 may be disposed on the support member 320 with rotational symmetry. This is particularly useful where the gas flows radially outwardly from the opening 301 in all directions equally. However, either by means of independent control of heating elements or segments of heating elements, or by locating the heating and cooling elements in particular chosen configurations, specific patterns of cooling can be obtained that may be suitable in specific applications where for any reason there is a need to provide such a specific cooling pattern.

Embodiments of the present invention allow for the possibility that there may be a local relative raised wafer temperature at positions just facing the outlet 301. This may be acceptable because such a central area of locally higher temperature can be compensated for by an annular area of lower temperature arranged around the central area, thereby exploiting the relatively high thermal conductance of a typical silicon wafer.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm.

While specific embodiments of the invention have been described above, it will be appreciated that the invention may be practised otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A lithographic apparatus comprising:
   a substrate table constructed to hold a substrate;
   a projection system configured to project a patterned radiation beam through an opening and onto a target portion of the substrate;
   a conduit configured to deliver gas to the opening, and provide a flow of the gas out of the opening to a space between the projection system and the substrate table and onto the substrate at a velocity sufficiently high that, at an opening defining wall of the conduit, a temperature of the as is lower than a temperature of the opening defining wall of the conduit;
   wherein the opening defining wall is constructed and arranged to thermally insulate the gas from walls of the projection system;
   wherein the lithographic apparatus is provided with a temperature control device disposed in a space between the projection system and the substrate table, said temperature control device configured to radially variably control the temperature of the gas in said space after the gas passes through said opening such that a heating effect of the gas on the substrate is reduced.

2. The lithographic apparatus as claimed in claim 1, wherein the temperature control device comprises temperature control means including both heating means and cooling means.

3. The lithographic apparatus as claimed in claim 2, wherein the heating means and the cooling means are mounted on a support member located in said space.

4. The lithographic apparatus as claimed in claim 3, wherein the support member is mounted on a surface of the projection system facing said substrate table.

5. The lithographic apparatus as claimed in claim 2, wherein said heating means comprises at least one resistive heating element.

6. The lithographic apparatus as claimed in claim 5, wherein said at least one resistive heating element comprises a plurality of independently controllable segments.

7. The lithographic apparatus as claimed in claim 2, wherein said heating means comprises a plurality of independently controllable heating elements.

8. The lithographic apparatus as claimed in claim 2, wherein said cooling means comprises at least one cooling element.

9. The lithographic apparatus as claimed in claim 8, wherein said at least one cooling element comprises a heat-pipe arranged to carry a cooling fluid cooled at a remote source.

10. The lithographic apparatus as claimed in claim 2, wherein said temperature control means is configured to control the amount of cooling by controlling the heating means.

11. The lithographic apparatus as claimed in claim 1, further comprising a metrology apparatus configured to measure overlay of a pattern projected onto the substrate by the lithographic apparatus, wherein an output from the metrology apparatus is used as a control input to a control system constructed and arranged to control operation of the temperature control device.

12. The lithographic apparatus as claimed in claim 1, further comprising a measurement apparatus configured to measure infrared reflectivity of the substrate, wherein the measured reflectivity of the substrate is used as a control input to a control system constructed and arranged to control operation of the temperature control device.

13. A device manufacturing method comprising:
projecting a patterned beam of radiation through an opening in a projection system onto a substrate;
delivering gas to the opening in the projection system via a conduit, and onto a surface of the substrate; and
controlling the temperature of the gas after the gas passes through said outlet such that the temperature of the gas is controlled in a space between the projection system and the substrate.

14. A method as claimed in claim 13, wherein the temperature control comprises cooling that is achieved by over-cooling using a cooler and heating using a heater.

\* \* \* \* \*